(12) United States Patent
Niemann

(10) Patent No.: US 9,645,193 B2
(45) Date of Patent: May 9, 2017

(54) IMPEDANCE SOURCE RANGING APPARATUS AND METHOD

(71) Applicant: KEITHLEY INSTRUMENTS, INC., Cleveland, OH (US)

(72) Inventor: James A. Niemann, Chagrin Falls, OH (US)

(73) Assignee: Keithley Instruments, LLC, Solon, OH (US)

( * ) Notice: Subject to any disclaimer, the term of this patent is extended or adjusted under 35 U.S.C. 154(b) by 0 days.

(21) Appl. No.: 13/658,055

(22) Filed: Oct. 23, 2012

(65) Prior Publication Data

US 2014/0111186 A1 Apr. 24, 2014

(51) Int. Cl.
*G01R 17/02* (2006.01)
*G01R 31/28* (2006.01)
(Continued)

(52) U.S. Cl.
CPC .......... *G01R 31/2839* (2013.01); *G01R 1/203* (2013.01); *G01R 15/12* (2013.01)

(58) Field of Classification Search
CPC ........ G01R 15/08; G01R 15/12; G01R 17/16; G01R 1/203; G01R 31/2839; G01R 17/02; G01R 17/00; G01R 17/10; G01R 17/12; G01R 17/14; G01R 31/2812; G01R 31/08; G01R 31/002; G01R 31/3658; G01R 27/00; G01R 27/02; G01R 27/08; G01R 35/00; G05F 1/571; G05F 1/573; G05F 1/652; H03K 17/163

USPC .... 324/98, 525, 756.06, 715, 616, 176, 430, 324/99 R, 691, 600–603, 609–614, 324/713–714; 326/30
See application file for complete search history.

(56) References Cited

U.S. PATENT DOCUMENTS 4,315,210 A * 2/1982 Michel et al. ................ 324/612
5,039,934 A 8/1991 Banaska
(Continued)

FOREIGN PATENT DOCUMENTS

| EP | 1426772 B1 | 3/2008 |
|---|---|---|
| TW | I221196 B | 9/2004 |
| TW | I248516 B | 2/2006 |

*Primary Examiner* — Tung X Nguyen
*Assistant Examiner* — Lee Rodak
(74) *Attorney, Agent, or Firm* — Marger Johnson; Thomas F. Lenihan

(57) ABSTRACT

An impedance sourcing circuit for a measurement device configured to measure a device under test (DUT) and method are disclosed. The impedance sourcing circuit includes a voltage/current source. An electrically controlled variable resistance having a control input is configured to adjust the variable resistance is coupled to the DUT. A loop gain controller is coupled to the control input of the electrically controlled variable resistance. The loop gain controller is configured to drive the control input of the electrically controlled variable resistance to adjust the variable resistance to generally match the impedance of the DUT. The impedance sourcing circuit may also include a voltage detector configured to detect a voltage across the DUT and a voltage reference. The loop gain controller may be configured to drive the control input of the electrically controlled variable resistance based on the voltage detected across the DUT and the voltage reference.

6 Claims, 7 Drawing Sheets

(51) Int. Cl.
    *G01R 1/20*          (2006.01)
    *G01R 15/12*       (2006.01)

(56) References Cited

U.S. PATENT DOCUMENTS 5,144,154 A     9/1992  Banaska
    6,204,647 B1 *  3/2001  Niemann et al. ............. 323/282
    6,504,395 B1   1/2003  Johnson \* cited by examiner

IMPEDANCE SOURCE RANGING APPARATUS AND METHOD

FIELD OF INVENTION

This invention relates generally to electrical measurements and, in particular, to source measure units.

BACKGROUND

Source measure units (SMU) are used to make precision measurements in many fields, including the testing of semiconductor products. For example, U.S. Pat. No. 5,039,934 describes one such device and range-changing in such a device is described in U.S. Pat. No. 5,144,154, both of which are incorporated herein by reference in their entireties. Typical SMU designs include a voltage or current source with integrated voltage and current measurement capabilities. A device under test (DUT) is coupled to the SMU and is then stimulated with either the voltage or current source. A typical SMU will operate properly so long as the load impedance matches the selected SMU sourcing method. If the SMU is configured to source voltage and measure current (SVMI) then a high impedance load is desirable. If the SMU is configured to source current and measure voltage (SIMV), a low impedance load is desirable. In practice, the load impedance may not match the SMU source impedance. This can lead to ringing and other transient problems. Additional problems surface when the load impedance changes with frequency, e.g., the correct sourcing method for DC is not the correct method at higher frequencies. Existing SMU designs do not change their character to adapt to changing DUT impedances with frequency. It would be desirable to provide improved source impedance ranging capabilities to address these problems.

SUMMARY OF THE INVENTION

An impedance sourcing circuit for a measurement device configured to measure a device under test (DUT) and method are disclosed. The impedance sourcing circuit includes a voltage/current source electrically coupled to the DUT. An electrically controlled variable resistance having a control input is configured to adjust the variable resistance is coupled to the DUT. A loop gain controller is coupled to the control input of the electrically controlled variable resistance. The loop gain controller is configured to drive the control input of the electrically controlled variable resistance to adjust the variable resistance to generally match the impedance of the DUT. The impedance sourcing circuit may also include a voltage detector configured to detect a voltage across the DUT and a voltage reference. The loop gain controller may be configured to drive the control input of the electrically controlled variable resistance based on the voltage detected across the DUT and the voltage reference.

The loop gain controller may include an operational amplifier (op-amp) configured to drive the control input of the electrically controlled variable resistance based on the voltage detected across the DUT and the voltage reference. A voltage reference circuit may be provided and configured to divide a voltage supplied by the voltage/current source in half. The voltage reference circuit may include a buffer amplifier with a resistive voltage divider coupled to the non-inverting input. The electrically controlled variable resistance may be configured as a voltage controlled current source.

The impedance sourcing circuit may also include an outer loop configured for current/voltage sourcing and measurement of at least one electrical characteristic of the DUT. The impedance sourcing circuit may also include a gain compression/expansion circuit configured to increase the transconductance (gm) of the voltage/current source. The voltage/current source may be configured as a voltage source or a current source.

A method of providing an impedance sourcing circuit for a measurement device configured to measure a device under test (DUT) is also disclosed. The method includes sourcing a voltage/current source to the DUT. An electrically controlled variable resistance having a control input configured to adjust the variable resistance is provided. The control input of the electrically controlled variable resistance is driven to adjust the variable resistance to generally match the impedance of the DUT. The method may also include detecting a voltage across the DUT and generating a voltage reference. The method may also include driving the control input of the electrically controlled variable resistance based on the voltage detected across the DUT and the voltage reference.

The method may also include providing an operational amplifier (op-amp) configured to drive the control input of the electrically controlled variable resistance based on the voltage detected across the DUT and the voltage reference. The method may also include providing a voltage reference circuit configured to divide a voltage supplied by a voltage/current source in half to generate the voltage reference. A voltage reference circuit may also be provided, the voltage reference circuit having a buffer amplifier with a resistive voltage divider coupled to the non-inverting input to generate the voltage reference. The electrically controlled variable resistance may be configured as a voltage controlled current source.

The method may also include providing an outer loop configured for current/voltage sourcing and measurement of an electrical characteristic of the DUT. Gain compression/expansion circuitry may be provided, the gain compression/expansion circuitry being configured to increase the transconductance (gm) of a voltage/current source.

DETAILED DESCRIPTION OF THE INVENTION

Traditional SMU designs using current or voltage (I/V) source based topologies do not change their impedance characteristics to adapt to varying DUT impedances, or frequency-based DUT impedance changes. Disclosed herein is an apparatus and method that uses a voltage programmable "Impedance Source" that may be used in place of typical I/V source based topologies.

There are several underlying problems associated with high speed current measurements using traditional current or voltage source based topologies. The first involves the presence of a capacitive load. With a capacitive load conventionally designed I/V converter sensing resistors will interact with the DUT impedance, placing a pole in the feedback pathway. This unwanted pole will compromise I/V amplifier, e.g., voltage source, stability and bandwidth. For the case of the I/V converter, a zero volts voltage source is directly impressed upon the capacitive load. The current measurement will then be the sum of the current generated by the I/V noise voltage impressed upon the capacitive load and the DUT current.

Sometimes the DUT current depends upon this applied voltage, as it does for a resistive load, and sometimes the device itself generates its own current, as is the case for a solar cell, which does not actually require the presence any stimulus (except light) but is capacitive none the less. This DUT capacitance will ultimately degrade the signal to noise ratio.

The second problem to overcome is that the stray capacitance of the I/V converter's current sense resistor. This stray capacitance interacts with the current sense resistor to form a pole in the I/V transfer function. To make matters worse, some capacitance in this location is required to maintain stability of this feedback ammeter I/V converter topology. This is a fundamental problem for traditional I/V source based topologies.

The disclosed voltage programmable Impedance Source architecture provides the following capabilities:

1) Ample phase margin to provide a stable output into the DUT;

2) Compensation for frequency based DUT impedances changes;

3) Allows for sourcing and measuring I and V (especially low currents) without a DUT induced frequency dependence;

4) Allows for sourcing I and V just as well as a traditionally designed SMUs;

5) Changes its impedance characteristics to suit changing DUT impedances.

Figure 1A:
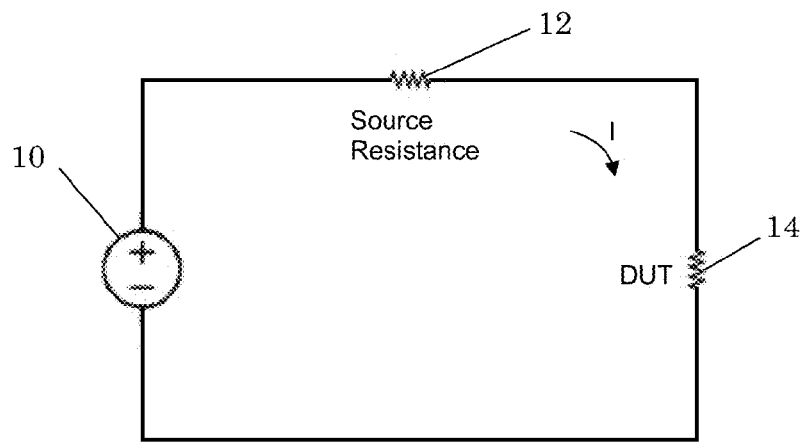
FIG. 1A is a block diagram of a circuit including an ideal impedance source.

FIG. 1A is a block diagram of a circuit including an ideal impedance source. The circuit includes a voltage source 10, a source resistance 12 and a DUT 14. It follows that:

$Zn1$ is the Johnson noise of the DUT 14 compared to the amplitude of the signal voltage at the DUT (ppm)

$Zn2$ is the Johnson noise of the current measuring element 12 (source resistance) compared to the amplitude of the current measurement (ppm).

$Zn3$ is the noise at the voltage source 10 compared to the amplitude of the voltage source 10 (also in ppm).

Figure 1B:
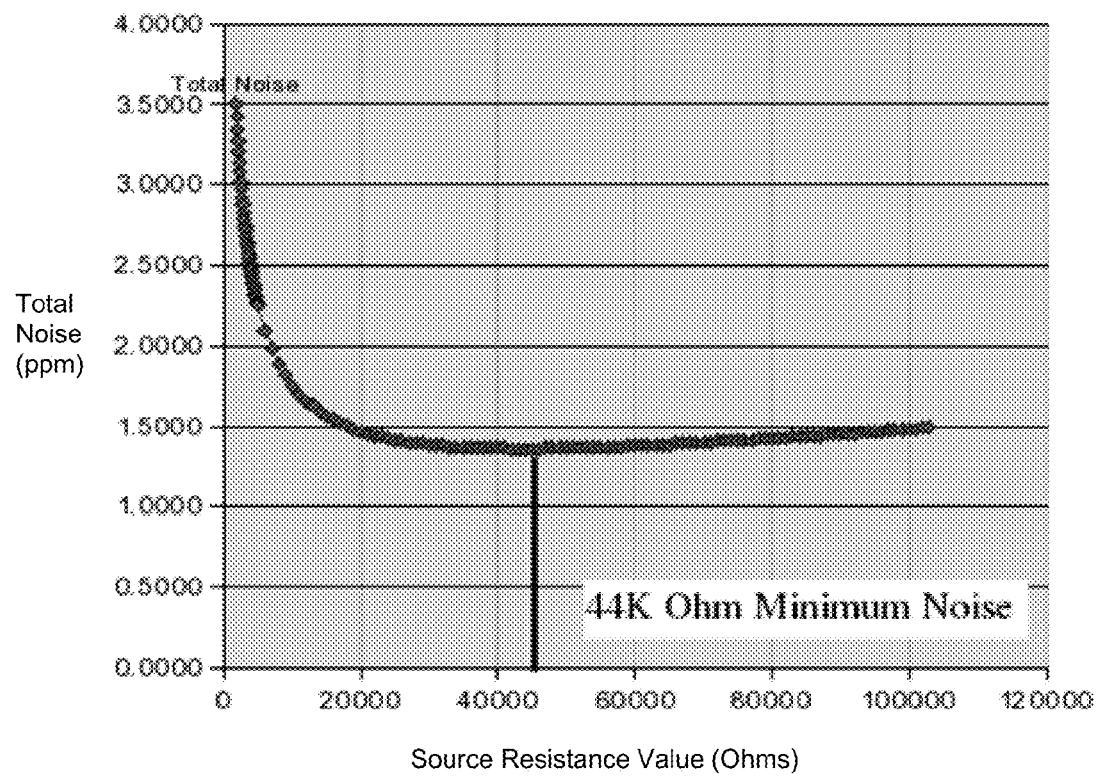
FIG. 1B is a noise calculation for a 44K ohm resistive DUT for a range of source resistances.

FIG. 1B is a noise calculation, accounting for the noises calculated above, $Zn1$, $Zn2$, and $Zn3$, for a 44K ohm resistive DUT, for a range of source resistances. The minimum noise is realized when the source resistance generally matches the DUT resistance.

Figure 1C:
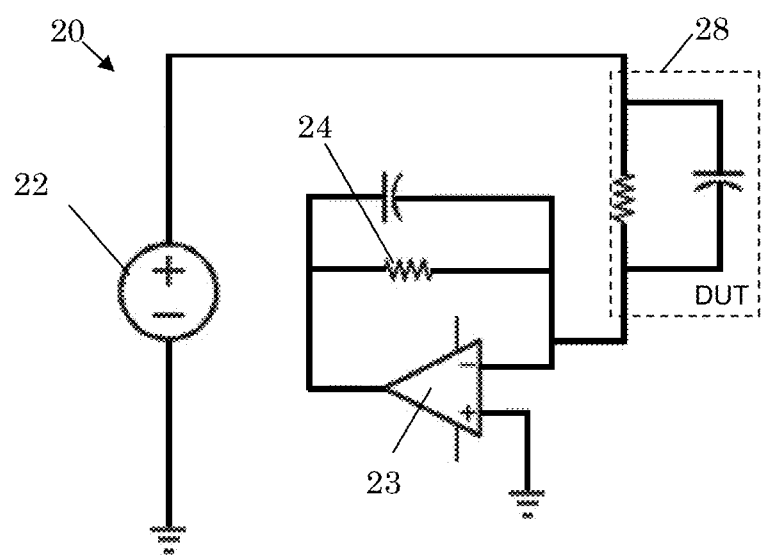
FIG. 1C is a simplified block diagram of a typical feedback ammeter.

FIG. 1C is a simplified block diagram of a typical feedback ammeter 20. Feedback ammeter circuit 20 operates at a conceptual level similarly to the ammeter circuit found in typical SMU. For purposes of this disclosure the feedback ammeter circuits disclosed herein contain sufficient detail to describe the important aspects of subject matter disclosed herein. It should be understood that the subject matter disclosed herein may be used in connection with a variety of test and measurement devices including an SMU. The feedback ammeter 20 includes a voltage source 22 coupled to a DUT 28. In this example, the DUT 28 is shown has having a resistive and capacitive component. Amplifier 23 is configured for application of the voltage source 22 (for high impedance DUT's) and will step, charge, and settle the load capacitance quickly. The current through the DUT capacitance is described by the familiar relation: $I=C\,dv/dt$. From this equation one can easily see that once the applied voltage source is settled ($dv/dt=0$), the capacitor current quickly falls to zero removing it from the impedance measurement. However, in this configuration, the current measurement will continue to settle at the time constant of the feedback ammeters current sense resistance and the capacitance across the sensing resistor. Disappointingly, often, additional capacitance must be added across resistor 24 just to keep the feedback ammeter frequency stable. This additional capacitance will slow the current measure circuit even more.

Figure 2A:
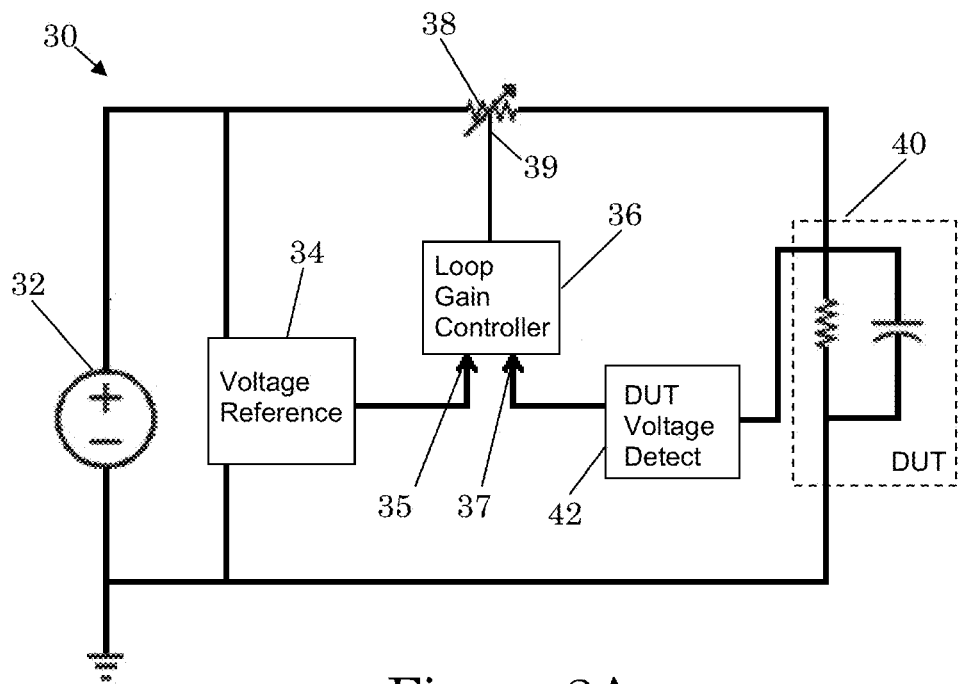
FIG. 2A is a basic block diagram showing an inner loop for an impedance source topology.

In order to overcome the problems outlined above, an impedance source topology may be used and may be broken down into two independent loops, an inner loop and an outer (noninteracting) loop. FIG. 2A is a basic block diagram showing an inner loop 30 of an SMU configured for an impedance source topology. The inner loop includes a voltage source 32 coupled to a DUT 40 via an electrically controlled variable resistor 38. In this example, the DUT 40 is shown has having a resistive and capacitive component. It should be understood that the DUT may comprise a variety of electrical component(s) having resistive, capacitive and/or inductive characteristics. The voltage source 32 is also coupled to a voltage reference 34. The voltage reference 34 is configured to generate a reference output that is coupled to a first input 35 of a loop gain controller 36. The loop gain controller has an output coupled to a control input 39 of the electrically controlled variable resistor 38. A voltage detector 42 is coupled to the DUT 40 and has a voltage detect output coupled to a second input 37 of loop gain controller 36.

In operation, the voltage reference is generally configured to divide the output of voltage source 32 in half. This causes half of the voltage source to appear at the first input 35 of the loop gain controller. The voltage detected at the DUT is coupled to the second input 37 of loop gain controller 36. The loop gain controller 36 is configured to adjust its output based on the difference between the inputs 35, 37. If the inputs 35, 37 match then the output of the loop gain controller 36 does not change. If the inputs 35, 37 do not match the loop gain controller changes, up or down, depending on which voltage signal coupled to inputs 35 and 37 is larger. The output of the loop gain controller 36 drives the control input 39 of the electrically controlled variable resistor 38 so that half of the voltage from voltage source 32 appears across the DUT 40 and half of the voltage from voltage source 32 appears across the electrically controlled variable resistor 38. When this occurs, the source impedance matches the DUT 40 impedance.

Figure 2B:
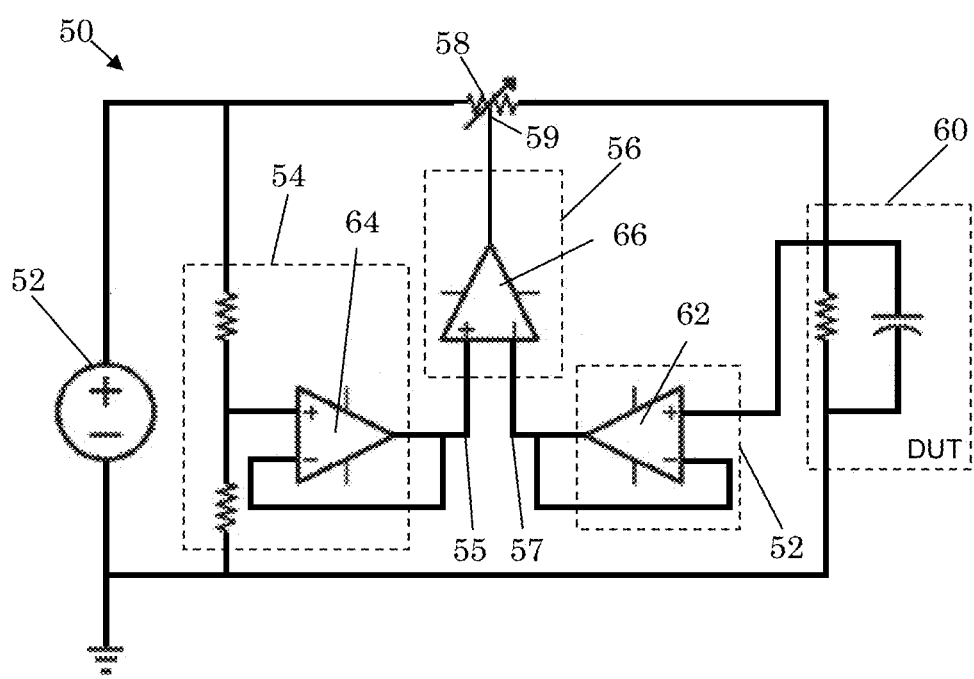
FIG. 2B is a schematic diagram showing an inner loop for an impedance source topology.

FIG. 2B is a schematic diagram showing an inner loop 50 for an impedance source topology. The inner loop includes a voltage source 52 coupled to a DUT 60 via an electrically controlled variable resistor 58. The voltage source 52 is also coupled to a voltage reference 54. In this example, the voltage reference 54 is implemented using an operational amplifier (op-amp) 64 configured as a buffer amplifier (unity gain) with a resistive voltage divider coupled to the non-inverting input. The voltage reference 54 is configured to produce a reference output at a voltage level that is half of the voltage source 52. The reference output is coupled to a first input 55 of a loop gain controller 56.

In this example, the loop gain controller 56 is implemented using an op-amp 66 configured to adjust its output based on the difference between the inputs 55, 57. The loop gain controller 56 has an output coupled to a control input 59 of the electrically controlled variable resistor 58. A voltage detector 52 is coupled to the DUT 60 and has a voltage detect output coupled to a second input 57 of loop gain controller 56. In this example. The voltage detector 52 is implemented using an op-amp 62 configured as a buffer amplifier (unity gain).

In operation, the voltage reference is generally configured to divide output of voltage source 52 in half. This causes half of the voltage source to appear at the first input 55 of the loop gain controller. The voltage detected at the DUT is coupled to the second input 57 of loop gain controller 56. The loop gain controller 56 is configured to adjust its output based on the difference between the inputs 55, 57. If the inputs 55, 57 match then the output of the loop gain controller 56 does not change. If the inputs 55, 57 do not match the loop gain controller changes, up or down, depending on which voltage signal coupled to inputs 55 and 57 is larger. The output of the loop gain controller 56 drives the control input 59 of the electrically controlled variable resistor 58 so that half of the voltage from voltage source 52 appears across the DUT 60 and half of the voltage from voltage source 52 appears across the electrically controlled variable resistor 58. When this occurs, the source impedance matches the DUT 60 impedance.

The impedance source topology discussed above will servo both the dv/dt across the load, and the dv/dt across the programmed resistance to zero. At the onset of a step change in voltage or a change in the load impedance, the impedance loop will do whatever is required (to the source resistance) to "fix" the DUT voltage to be half of the source voltage. To accomplish this, the programmable impedance may fall to milli-ohm values, or to whatever value is necessary. As long as load and step changes are lower bandwidth than that of the impedance loop, the measure impedance dv/dt and the DUT dv/dt will be zero as soon as the voltage or impedance change is settled.

Figure 3A:
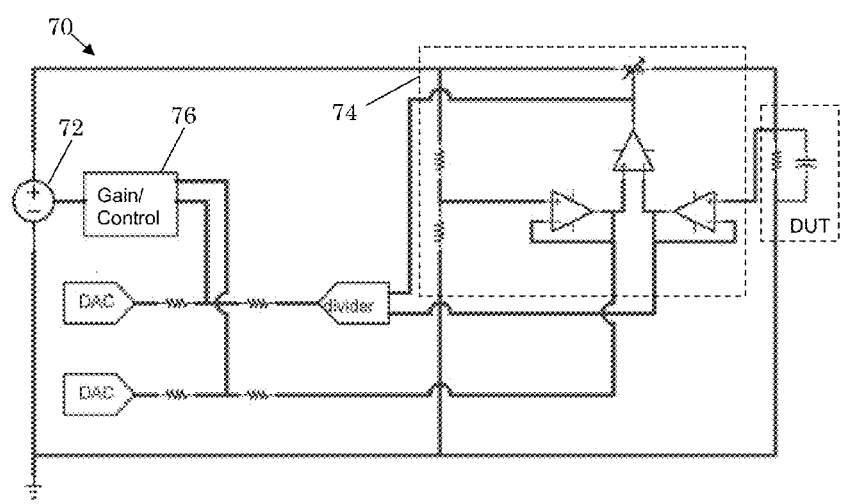
FIG. 3A is a block diagram of an SMU having an outer loop and an impedance source implemented in an inner loop.

The inner loop may be designed as described above as a variable resistance 38, 58. The inner loop may also be designed as a current source fed back by the inner loop to look like a variable resistance. FIG. 3A is a block diagram of an SMU 70 with an outer loop and an impedance source implemented in an inner loop 74. The outer loop is configured to provide typical SMU functionality including current/voltage sourcing and measurement of the electrical characteristics of the DUT as is well known in the art. In this example, a gain/control block 76 is configured to drive the voltage source 72. To implement the outer loop, the voltage source may be changed to a current source and the ground (and power supplies) may be moved to the positive terminal of the voltage source. Such modifications do not change the operation of the circuit.

In this example, the variable resistance can be implemented as a trans-impedance amplifier (a voltage controlled current source). Whether an impedance or a current source is used, the following SMU wrapper can be used to implement the SMU around the inner, low loop gain, impedance source loop (which provides improved stability into reactive loads, instrument noise immunity and lower glitches).

Figure 3B:
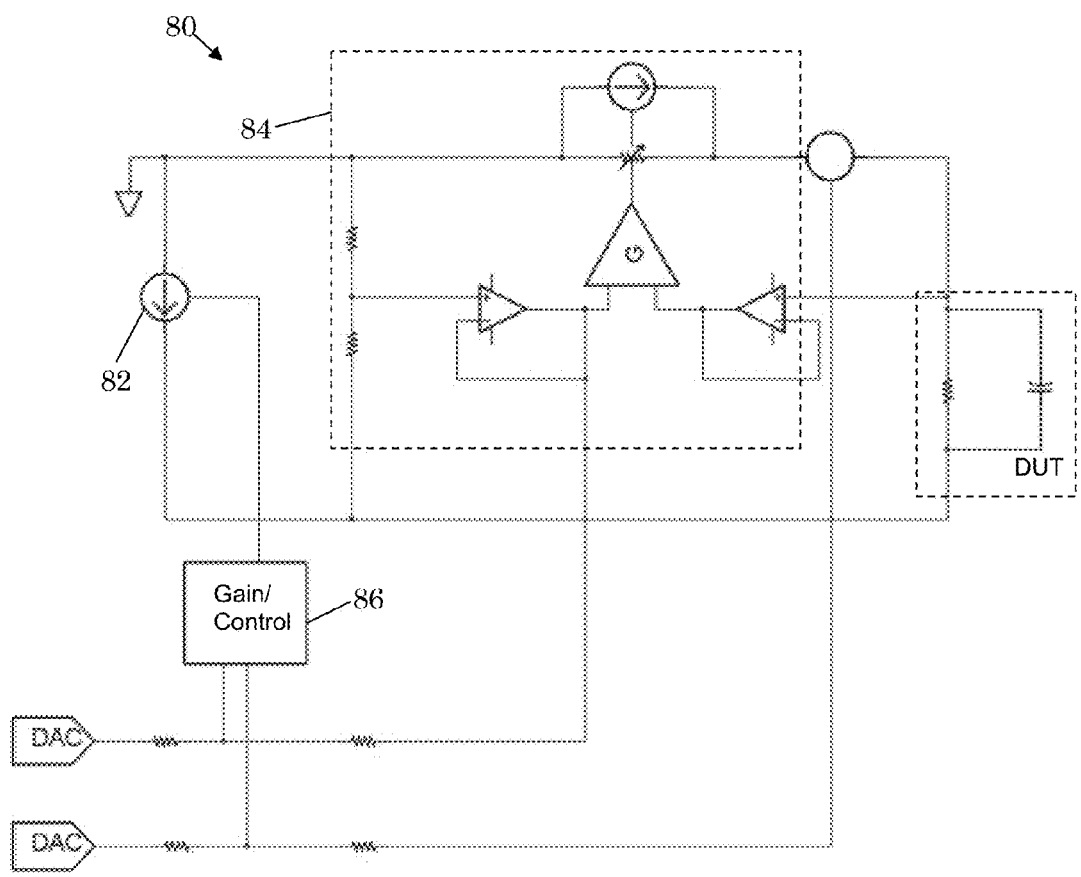
FIG. 3B is a block diagram of an SMU having an outer loop and an impedance source implemented in an inner loop.

FIG. 3B is a block diagram of an SMU 80 having an outer loop surrounding an impedance source implemented in an inner loop 84. The outer loop is configured to realize all of the common SMU functions, e.g., source voltage and source current 82 as is known in the art. The SMU may also be configured to source power and source resistance. The source resistance mode is simplified using this configuration since the inner loop is already configured to perform this function.

The outer loop basically controls sum of the load plus the voltage across the impedance source regardless of which loop is in control, voltage, or current, power or resistance. The gain/control block 86 illustrated provides gain and the switching circuitry or "clamps" as is known in the art.

The outer loop is to be designed symmetrically to the inner loop 84 (especially so if the current source is used for the inner loop instead of the variable resistance) such that temperature variations of each loop will cancel providing temperature tracking as well as the cancellation of other nonlinearities.

Gain Compression:

If the inner loop is designed and built around a current source controlled to be an identical impedance to the load, there may be a bandwidth and stability problem with some loads. The stability of this inner loop can be improved by taking advantage of gain compression/expansion circuitry within the impedance source and outer loop gain pathways. Essentially the circuitry increases the loop gain by increasing the transconductance (gm) of the current source(s) for high load currents whether they are due to a dc load or to a large capacitive load and decrease the loop gain for light loads. The gain compression/expansion circuitry has the effect of stabilizing the open loop zero db gain crossing regardless of load. As an example, for a current source with a gm of 1, an inner loop gain of 100, and a 1G load, the impedance source inner loop will oscillate without 15 uf of load capacitance. With gain compression, the high gm of 1 will end up as low as 1e-9, returning the loop to stable operation. Low impedance, low capacitance loads are not a problem. For these loads, the gm will remain at 1, but do not oscillate since the load resistance also limits the gm in this arrangement.

Figure 3C:
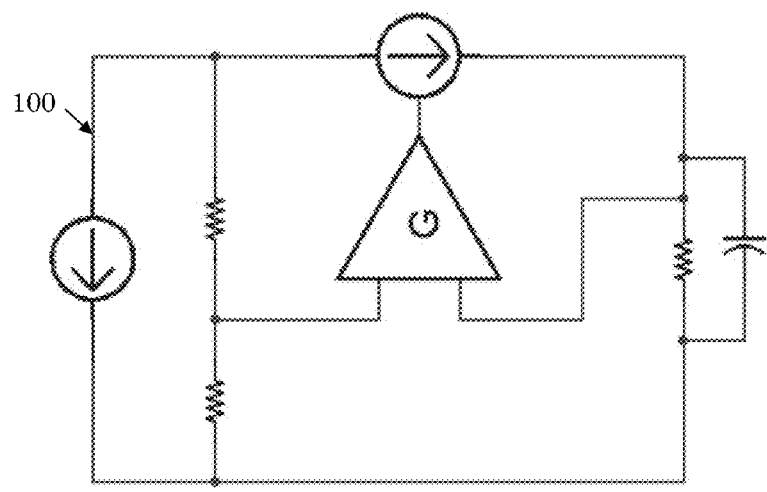
FIG. 3C is a simplified block diagram of a basic inner loop of an impedance source illustrating the inner loop gain.

FIG. 3C is a simplified block diagram of a basic inner loop 100 illustrating the inner loop gain. The loop gain for a basic impedance source loop can be developed: Vo=I*Zdut=>1=Vin*G*gm=>Vo=Vin*G*gm*Zdut=>Vo/Vin=gm*G*Zdut.

Figure 3D:
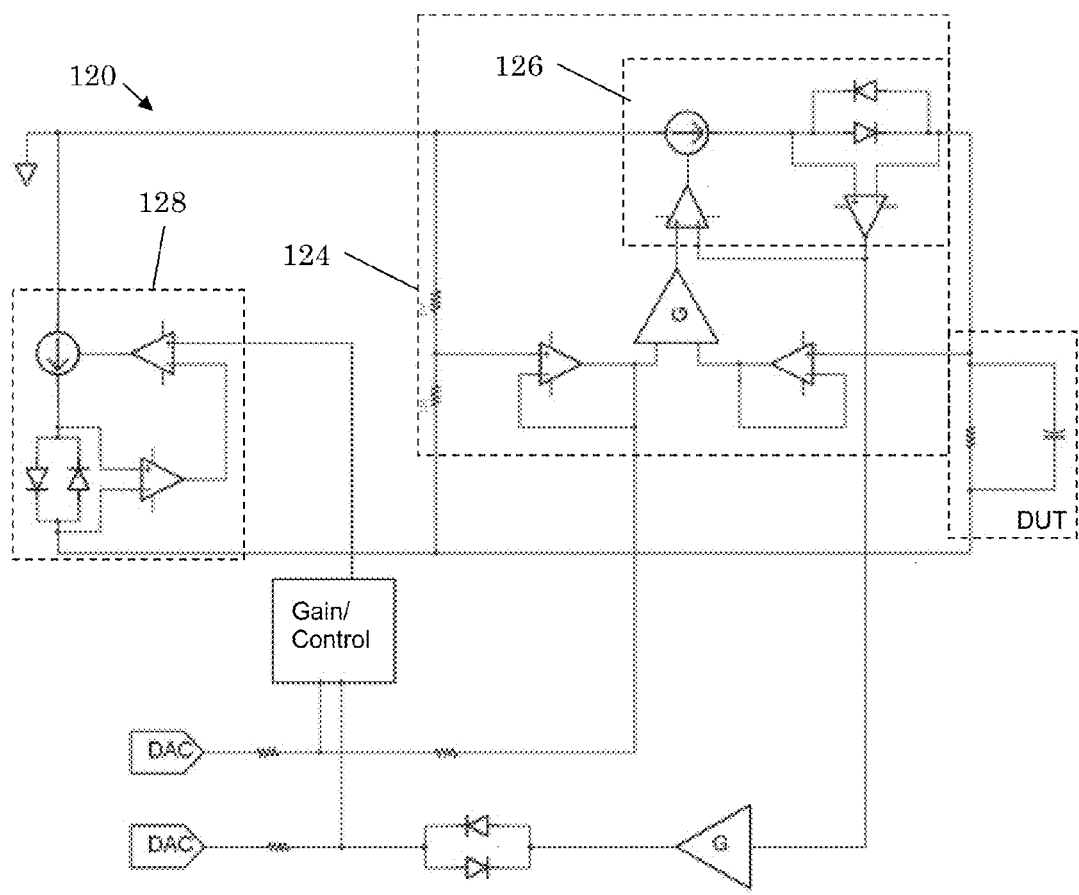
FIG. 3D is a block diagram of an SMU having an impedance source with the addition of gain compression/expansion.

FIG. 3D is a block diagram of an SMU 120 having an outer loop and an impedance source 124 implemented in an inner loop with the addition of gain compression/expansion circuitry 126, 128. In FIG. 3D, the gm changes as the diode impedance changes providing the gain compression/expansion.

It should be understood that many variations are possible based on the disclosure herein. Although features and elements are described above in particular combinations, each feature or element can be used alone without the other features and elements or in various combinations with or without other features and elements.

What is claimed is:

1. An impedance sourcing circuit for a measurement device configured to measure a device under test (DUT), the impedance sourcing circuit comprising:
  a voltage/current source coupled to the DUT;
  an electrically controlled variable resistor coupled between the voltage/current source and the DUT, the electrically controlled variable resistor having a control input configured to adjust the variable resistance;

a loop gain controller implemented by a first operational amplifier (op-amp) coupled to the control input of the electrically controlled variable resistor;

a voltage reference implemented by a second op-amp coupled to the voltage/current source and the first op-amp; and a voltage detector implemented by using a third op-amp configured as a buffer amplifier coupled to the DUT and the first op-amp, wherein the first op-amp is configured to drive the control input of the electrically controlled variable resistor to adjust the variable resistance to generally match the impedance of the DUT.

2. The impedance sourcing circuit of claim 1, wherein the first op-amp is configured to drive the control input of the electrically controlled variable resistor based on a difference between an output of the second op-amp and an output of the buffer amplifier.

3. The impedance sourcing circuit of claim 1, further comprising a resistive voltage divider coupled to a non-inverting input of the buffer amplifier.

4. The impedance sourcing circuit of claim 3, wherein the buffer amplifier and the resistive voltage divider are configured to divide a voltage supplied by the voltage/current source in half.

5. The impedance sourcing circuit of claim 1, further comprising an outer loop configured for current/voltage sourcing and measurement of an electrical characteristic of the DUT.

6. The impedance sourcing circuit of claim 1, further comprising a gain compression/expansion circuit configured to increase a transconductance (gm) of the voltage/current source.

* * * * *